United States Patent
Kim et al.

(10) Patent No.: US 8,432,729 B2
(45) Date of Patent: Apr. 30, 2013

(54) PHASE-CHANGE MEMORY WITH MULTIPLE POLARITY BITS HAVING ENHANCED ENDURANCE AND ERROR TOLERANCE

(75) Inventors: Jin-Ki Kim, Ottawa (CA); Peter B. Gillingham, Ottawa (CA); William F. Petrie, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 13/085,863

(22) Filed: Apr. 13, 2011

(65) Prior Publication Data

US 2012/0087182 A1   Apr. 12, 2012

Related U.S. Application Data

(60) Provisional application No. 61/323,401, filed on Apr. 13, 2010.

(51) Int. Cl.
   *G11C 11/00* (2006.01)
(52) U.S. Cl.
   USPC .......................................... 365/163; 365/148
(58) Field of Classification Search .................. 365/163, 365/148, 189.011
   See application file for complete search history.

(56) References Cited

U.S. PATENT DOCUMENTS

| 5,296,716 | A | 3/1994 | Ovshinsky |
| 5,873,112 | A | 2/1999 | Norman |
| 7,272,773 | B2 * | 9/2007 | Cargnoni et al. ............. 714/763 |
| 7,283,387 | B2 | 10/2007 | Cho et al. |
| 7,317,655 | B2 | 1/2008 | Cho et al. |
| 7,529,124 | B2 | 5/2009 | Cho et al. |
| 7,729,166 | B2 * | 6/2010 | Kim et al. ................ 365/185.03 |
| 7,783,846 | B2 | 8/2010 | Chainer |
| 7,796,427 | B2 | 9/2010 | Kim et al. |
| 7,852,685 | B2 | 12/2010 | Iwasa et al. |
| 2008/0101131 | A1 | 5/2008 | Lee et al. |
| 2008/0219047 | A1 | 9/2008 | Yu et al. |

OTHER PUBLICATIONS

Bedeschi, et al, IEEE, J. Solid-State Circuits, vol. 44, No. 1, pp. 217-227 (11 pages), Jan. 1, 2009.
Lee, et al, IEEE J. Solid-State Circuits, vol. 43, No. 1, pp. 150-162 (13 pages), Jan. 1, 2008.
Kang et al, IEEE J. Solid-State Circuits, vol. 42, No. 1, pp. 210-218 (9 pages), Jan. 1, 2007.
Oh, et al, IEDM Dig. Tech. Papers, 4 pages, Jan. 1, 2006.
Gill, et al, ISSCC Dig. Tech. Paper. 10 pages, Feb. 1, 2002.
Cho, et al, ISSCC Dig. Tech. Paper, 9 pages, Feb. 1, 2004.

* cited by examiner

*Primary Examiner* — Vu Le
(74) *Attorney, Agent, or Firm* — Shuji Sumi

(57) ABSTRACT

A Phase-Change Memory (PCM) apparatus including a data field for storing a data bits representing a data value or an inversion of the data value and a polarity field for storing a plurality of polarity bits for indicating that the data bits stored in the data field represent the data value or the inversion of the data value. In one embodiment an odd number of set polarity bits indicates that the data bits represent the inversion of the data value and an even number of set polarity bits indicates that the data bits represent the data value. The PCM apparatus has enhanced endurance and improved error tolerance.

10 Claims, 17 Drawing Sheets

PHASE-CHANGE MEMORY WITH MULTIPLE POLARITY BITS HAVING ENHANCED ENDURANCE AND ERROR TOLERANCE

CROSS-REFERENCE TO RELATED APPLICATIONS

This application claims priority from U.S. Provisional Patent Application Ser. No. 61/323,401 filed on 13 Apr., 2010 (Kim) for "DYNAMIC DATA POLARITY SCHEME IN PHASE CHANGE MEMORY (PCM)", the entire contents of which are incorporated herein by reference.

TECHNICAL FIELD

The present invention relates generally to Phase-Change Memory (PCM) and more particularly apparatuses and systems including a PCM with multiple polarity bits having enhanced endurance and improved error tolerance and methods of using same.

BACKGROUND OF THE INVENTION

One problem with Phase-Change Memory (PCM) devices is that activation current demands increase with the number of cells that are activated during a write operation. US Patent Application 2008/0101131, Ser. No. 11/790,146 for Lee et al., filed Apr. 24, 2007, for example, provides a PCM apparatus wherein new data that is to be written into cells is selectively inverted based on a comparison between pre-existing data and new data associated with a write command. A benefit of Lee is that fewer memory cells must be activated in many instances.

However, Lee requires an additional status bit (also known as a polarity bit or flip bit) for indicating whether the data has been inverted. If an error occurs in this status bit then all of the data bits which correspond to this status bit will be in error. This is especially critical when Error Correction Code (ECC) techniques are employed for mitigating the effects of errors caused by, for example, limited write endurance of PCM. ECC's, such as Hamming Codes, typically used in semiconductor memories can only correct single errors or detect double-bit errors. Hence, an error that occurs in the status bit is catastrophic compared to an error that occurs in the data bits.

A PCM having enhanced endurance and PCM with improved error tolerance is needed.

SUMMARY OF THE INVENTION

There is provided a Phase-Change Memory (PCM) apparatus with multiple polarity bits having enhanced endurance and improved error tolerance and systems using same.

According to an aspect of the invention there is provided a PCM apparatus including a data field for storing a plurality of data bits representing a data value or an inversion of the data value, and a polarity field for storing a plurality of polarity bits for indicating that the data bits stored in the data field represent the data value or the inversion of the data value. An odd number of set polarity bits indicates that the data bits represent the inversion of the data value and an even number of set polarity bits indicates that the data bits represent the data value.

Beneficially, the PCM apparatus includes a circuit for receiving data from the data field, a circuit for receiving polarity bits from the polarity field, a circuit for determining whether the data received from the polarity field has an odd number of set bits and for setting a previous polarity flag, and a circuit for inverting the data from the data field if there is an odd number of set bits in the bits received from the polarity field Beneficially, the PCM apparatus also includes a circuit for comparing data to be written to the data field with the data received from the data field and providing a difference, and a circuit for receiving the difference and receiving the polarity flag and determining whether invert the data to be written to the data field and determining whether to invert the difference for providing a data write mask.

Beneficially, the PCM apparatus also includes a circuit for determining whether a number set bits in the difference is greater than half of a total number of bits in the difference and providing a difference greater than bit a circuit for determining whether a number set bits in the difference is equal half of the total number of bits in the difference and providing a difference equal to bit, and a multiplexor circuit for providing a polarity bit that is equal to the previous polarity bit if the number set bits in the difference is equal half of the total number of bits in the difference or is equal to the difference greater bit if the number set bits in the difference is not equal to half of the total number of bits in the difference.

Beneficially, the PCM apparatus also includes an incrementing circuit for selectively incrementing the previous polarity bits and providing the new polarity bits if the new polarity flag is equal to the previous polarity flag, and a circuit for comparing the previous polarity bit with the new polarity bit and providing a polarity bit mask.

Beneficially, the PCM apparatus also includes a gray code incrementing circuit for selectively incrementing the previous polarity bits.

Beneficially, the PCM apparatus also includes a plurality of write drivers for selectively writing respective data bits.

According to another aspect of the invention there is provided a method of writing data to a data structure in a PCM apparatus, the method including reading a plurality of previous data bits and a plurality of previous polarity bits from the data structure in the PCM apparatus, determining if an odd number of the previous polarity bits are set, setting a previous polarity flag if an odd number of the previous polarity bits are set otherwise clearing the previous polarity flag, comparing data bits to be written with the plurality of previous data bits and determining a new plurality of polarity bits, selectively inverting the data bits to be written according to the new plurality of data bits, and writing only the selectively inverted data bits and new plurality of polarity that are different from the previous data bits and plurality of previous polarity bits respectively.

According to another aspect of the invention there is provided a method of reading data from a data structure in a Phase-Change Memory apparatus, the method including reading a plurality of data bits and a plurality of polarity bits from the data structure in the PCM apparatus; and if there is an odd number of the previous polarity bits set, inverting the data bits.

Therefore apparatuses and systems including a PCM with multiple polarity bits having enhanced endurance and improved error tolerance and systems using same have been provided.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
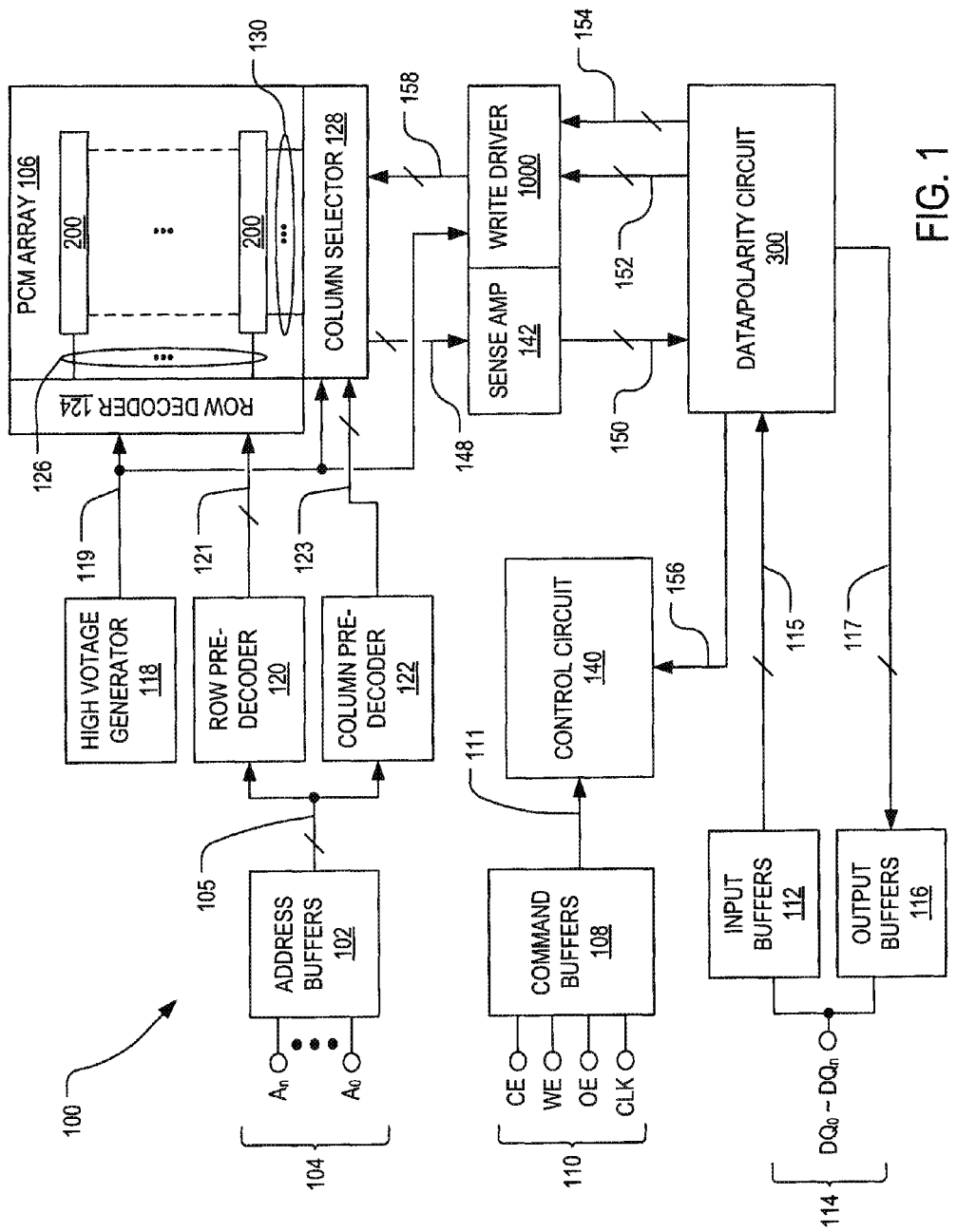
FIG. 1 is a block diagram of a Phase-Change Memory (PCM) apparatus in accordance with an embodiment of the invention.

It should be noted that in the descriptions of the accompanying drawings many conventional signals such as clock and control signals have not been included in the drawings for the sake of clarity and convenience.

Descriptions of signals for implementing data flow of embodiments have been provided for the purpose of explanation. As well, many of the drawings show simplified implementations of logic circuits. Persons of skill in the art will readily recognize that many logical equivalents are possible and are still within the scope of the present invention. Throughout the description of embodiments of the invention active high signals have been used for clarity. It is well known that equivalent active low signals may be used. The words set and clear are used in this disclosure to indicate a signal or data bit that is in an asserted state or non-asserted state respectively. These states may be implemented as high or low voltages as is well known in the art.

Referring to FIG. 1, there is shown a block diagram of a Phase-Change Memory (PCM) apparatus 100 in accordance with an embodiment of the invention. The PCM apparatus 100 includes a conventional interface having address signals 104, command signals 110, and data signals 114. It is to be understood that although an example interface to the PCM memory apparatus has been provided any interface known in the art may be used and still be within the scope of the present invention. For example, the interface may facilitate serial, parallel, or daisy chain connections.

The PCM apparatus further includes address buffers 102 for receiving the addresses signals 104 and providing buffered address signals 105 to a row pre-decoder 120 and column pre-decoder 122. The addresses signals 104 designate locations in a memory array 106 for reading and writing operations as described herein below. The row pre-decoder 120 provides a pre-decode row address 121 to a row decoder 124 which selects one of a plurality of bitlines 126. The selected one of the plurality of bitlines activates one of a plurality of data structures 200. The column pre-decoder 122 provides a pre-decoded column address 123 to a column selector 128 for selecting a subset of a plurality of bitlines 130.

The PCM apparatus 100 further includes command buffers 108 for receiving the command signals 110. The command signals are conventional and their functions are well known in the art. In this embodiment the command signals 110 include CE (Chip Enable), WE (Write Enable), OE (Output Enable), and CLK (Clock). The command buffers 108 provide buffered command signals 111 to a control circuit.

The control circuit 140 controls the address buffers 102, command buffers 108, input buffers 112, output buffers 116, high voltage generator 118, row pre-decoder 120, column pre-decoder 122, using conventional controls signals (not shown) in a conventional manner well known in the art. As will be described herein below the control circuit 140 controls a sense amp 142, write driver 1000, and data/polarity circuit 300 according to embodiments of the present invention as described herein below with reference to the flowcharts shown in FIGS. 13A to 16.

The PCM apparatus 100 also includes input buffers 112 for receiving data signals 114 and providing buffered data signals 115 to a data/polarity circuit 300 which is described herein below with reference to FIGS. 3 to 9. Output buffers 116 receive read data 117 from the data/polarity circuit 300 and provide the data signals 114.

A high voltage generator 118 provides a boosted voltage signal 119 for use in the row decoder 124, column selector 128, and write driver 1000.

The write driver 1000 selectively writes masked data bits and polarity bits 158 received from the data/polarity circuit 300 as described herein below with reference to FIG. 10.

The sense amp 142 receives data bits and polarity bits 148 from the PCM array 106 via the column selectors 128 and provides data bits and polarity bits 150 to the data/polarity circuit 300 during read and write operations as described herein below.

Figure 2:
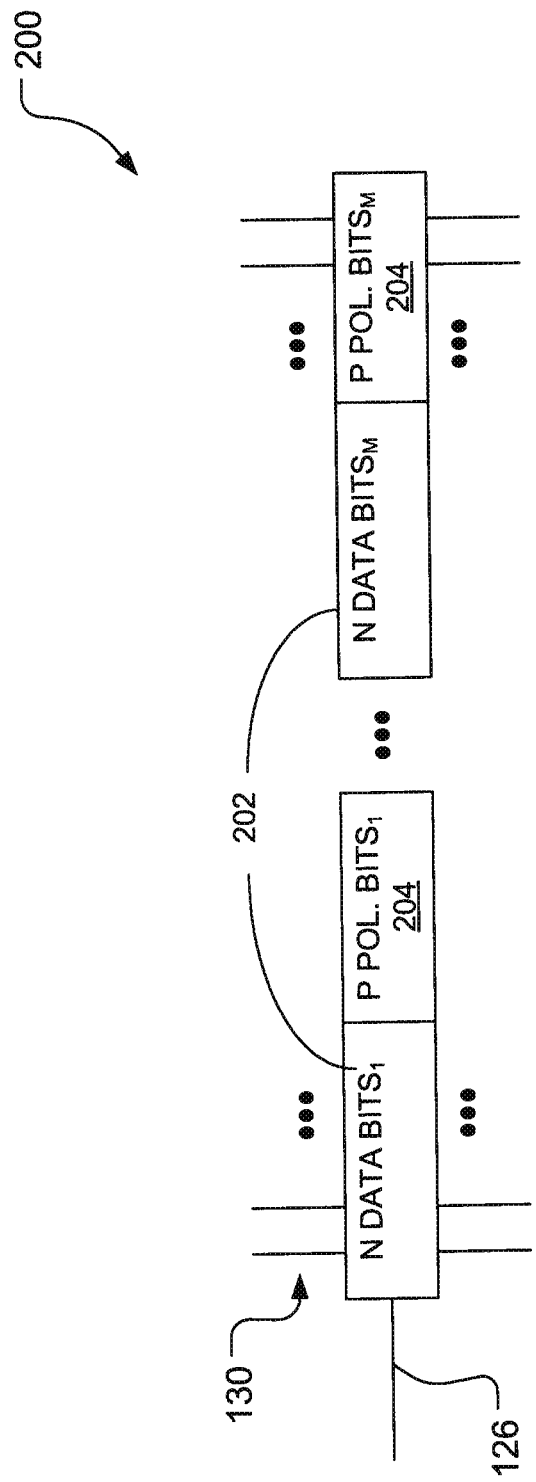
FIG. 2 is a block diagram of a data storage structure shown in FIG. 1.

Referring now to FIG. 2, there is shown an embodiment of the data structure 200 shown in FIG. 1. The data structure 200 includes M data fields 202 (where M>=1) for storing N data bits per field. Each data field 202 has a corresponding polarity field 204 for storing P polarity bits associated with data bits stored in the data field 202. The data bits stored in the data field 202 represent a data value or an inversion of the data value depending on bits stored in the polarity field 204. If there is an odd number of set polarity bits the data bits represent the inversion of the data value. If there is an even number of set polarity bits then the data bits represent the data value.

Figure 3:
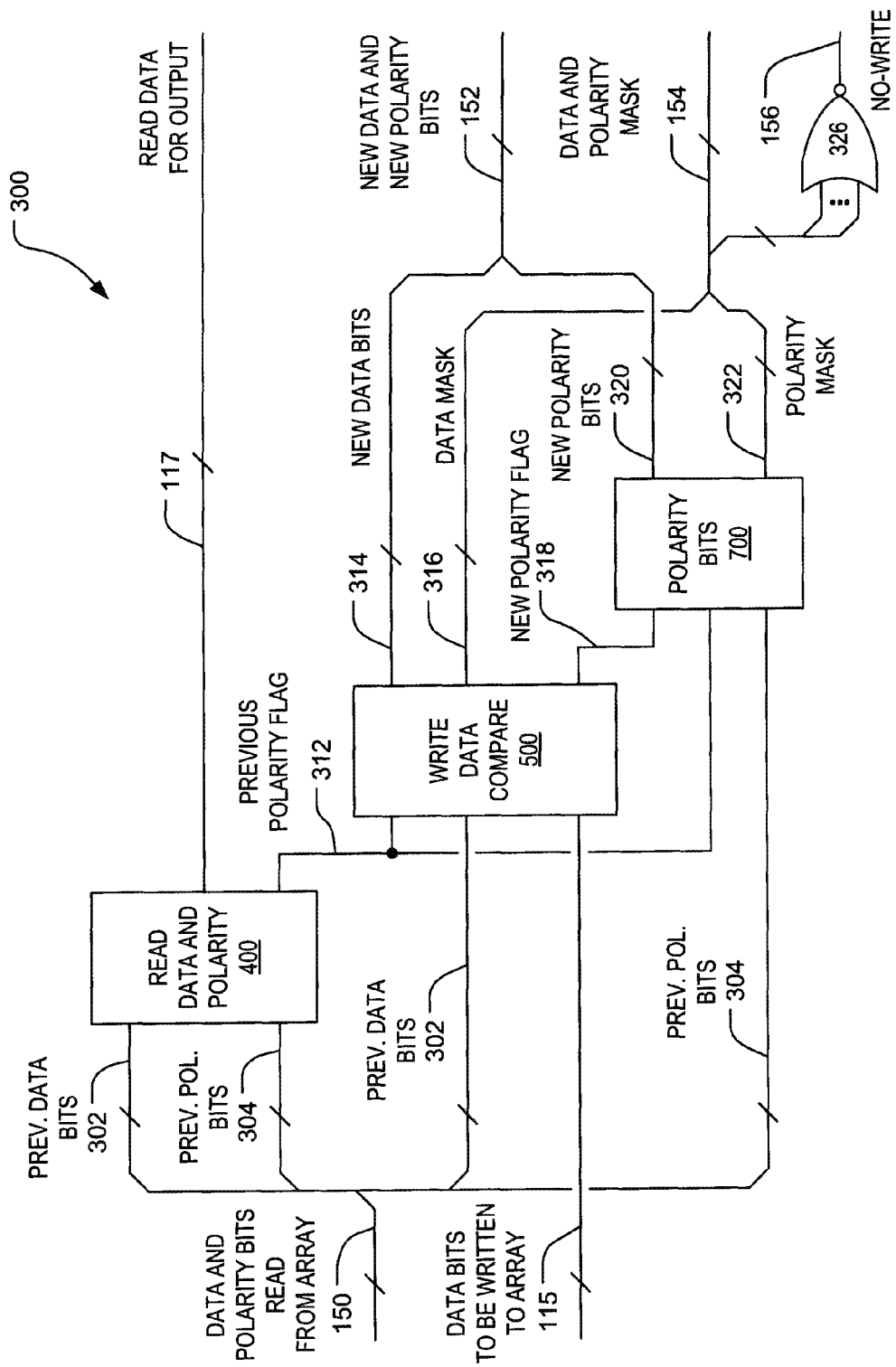
FIG. 3 is a block diagram of a data/polarity circuit shown in FIG. 1.

Referring to FIG. 3 there is shown an embodiment of the data/polarity circuit 300 shown in FIG. 1. The data/polarity circuit 300 receives data bits to be written to array 115 into the data structure 200 as well as data and polarity bits read from array 150 read from the data structure 200.

In a method of writing data to the data structure described herein below, data from the data structure 200 is pre-read before writing data to the data structure 200. Hence, this read data will be referred to as previous data bits 302 and previous polarity bits 304 as well as collectively shown in the Figures as data bits and polarity bits 150. Likewise, data and polarity bits that are written to the data structure are referred to as new data bits 314 and new polarity bits 320 as well as collectively shown in the Figures as new data and new polarity bits 152.

Figure 14:
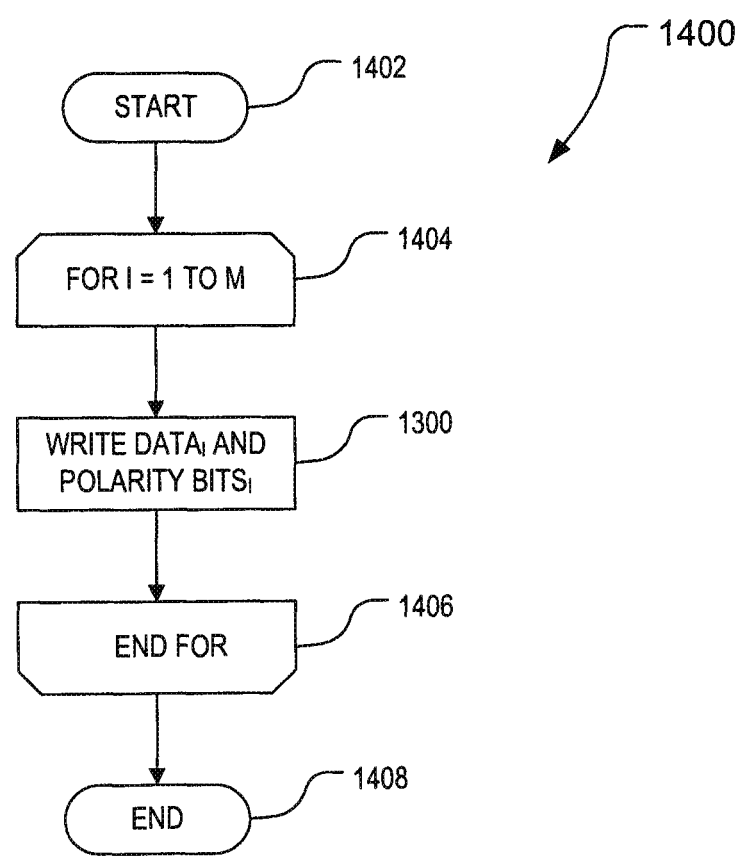
FIG. 14 is a flowchart of a method of writing data to a data storage structure shown in FIG. 2 in a burst mode.
Figure 15:
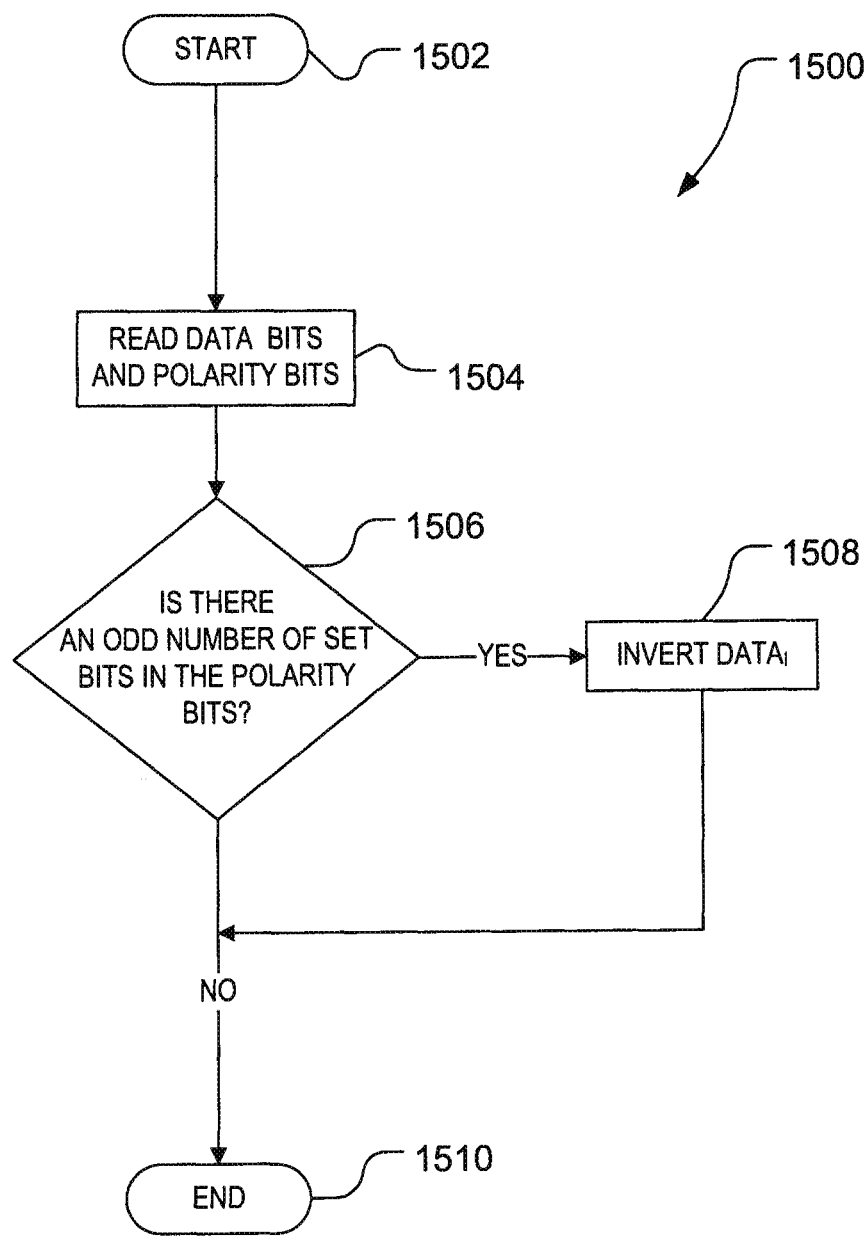
FIG. 15 is a flowchart of a method of reading data from the data storage structure shown in FIGS. 1 and 2.
Figure 16:
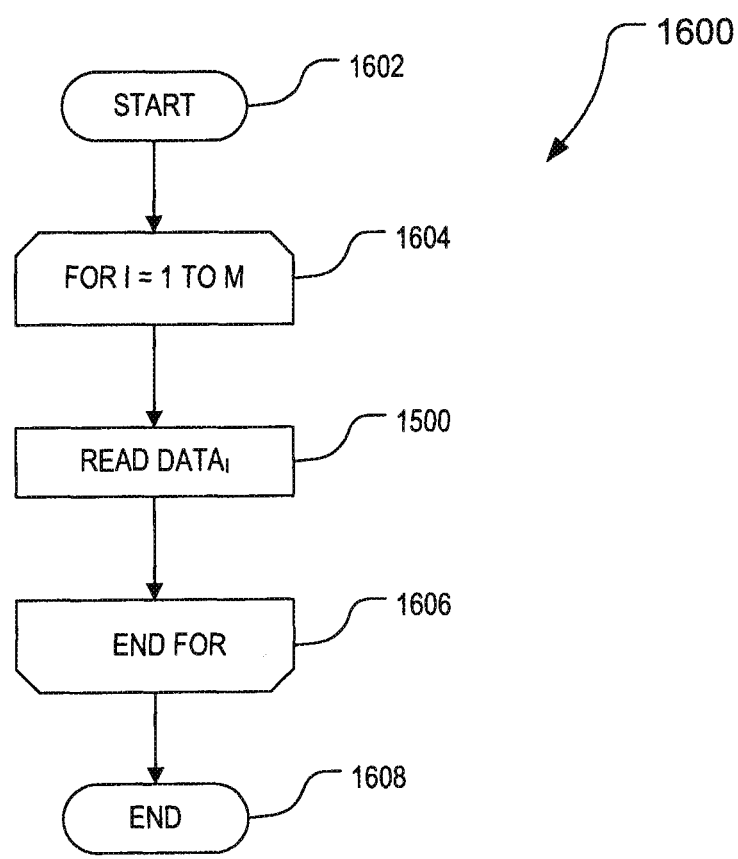
FIG. 16 is a flowchart of a method of reading data from the data storage structure shown in FIGS. 1 and 2 in a burst mode.

The data/polarity circuit 300 includes a read data and polarity circuit 400 for receiving the previous data bits 302 and previous polarity bits 304 and providing the read data 117 to the output buffers 116 during read operations described herein below with reference to FIGS. 15 and 16 as well as providing a previous polarity flag 312 during write operations described with reference to FIGS. 13A to 14. Further details of the read data and polarity circuit 400 are described herein below with reference to FIG. 4.

The data/polarity circuit 300 further includes a write data compare circuit 500 for receiving the previous polarity flag 312, the previous data bits 302, and the data bits to be written to array 115 to the data structure 200 in the array 106; and providing new data bits 314, a data mask 316, and a new polarity flag 318. Further details of the write data bit compare circuit 500 are described herein below with reference to FIGS. 5 and 6

The data/polarity circuit 300 further includes a polarity bits circuit 700 for receiving the new polarity flag 318, the previous polarity flag 312, and the previous polarity bits 304. The polarity bit circuit 700 provides new polarity bits 320 and a polarity mask 322. Further details of the polarity bit circuit 700 are described herein below with reference to FIGS. 7 to 9.

The data/polarity circuit 300 further includes a no-write circuit 326 for detecting when a write operation, as described herein below with reference to FIG. 13D, may be skipped and providing a no-write signal 156 to the control circuit 140.

Figure 4:
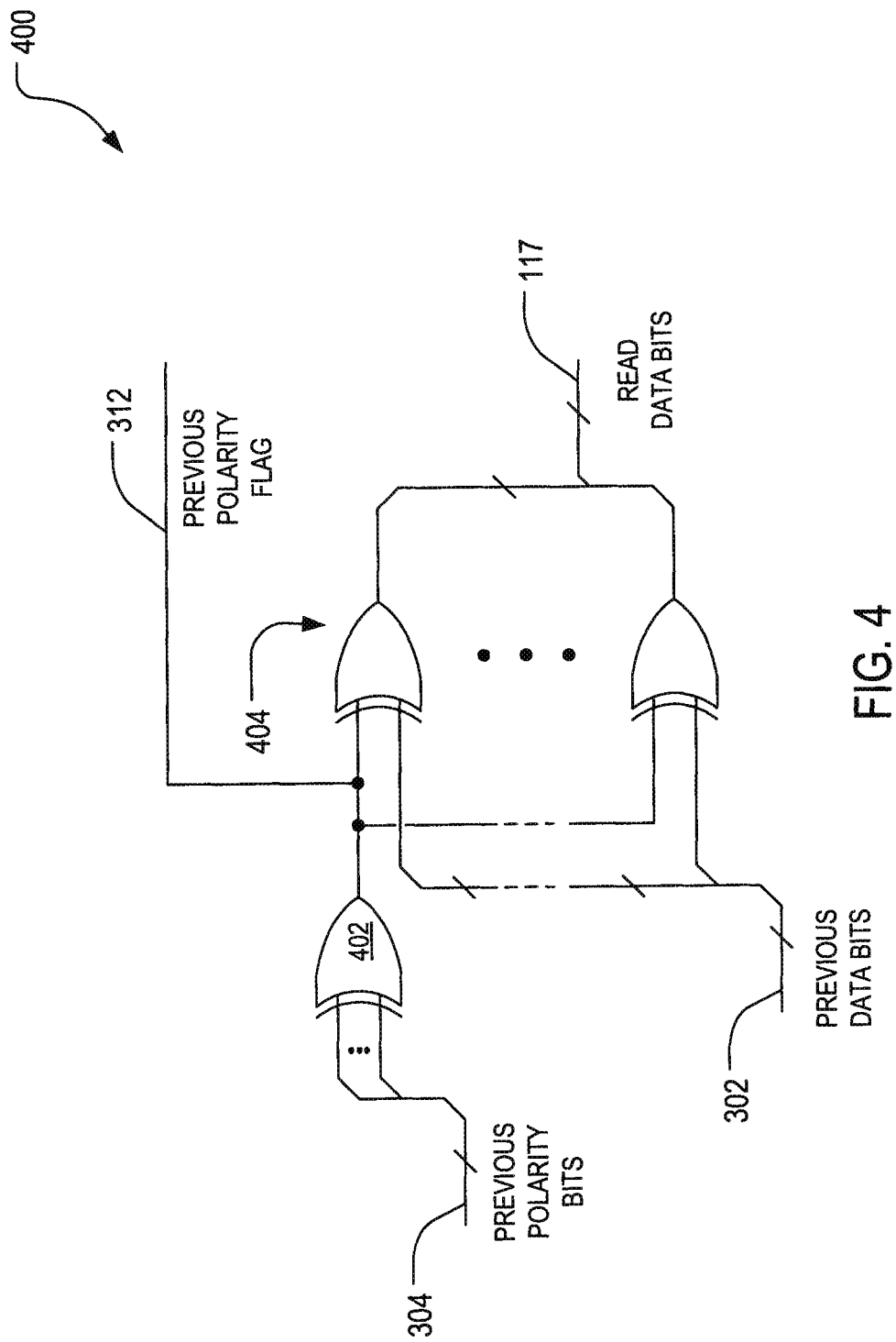
FIG. 4 is a block diagram of a read data and polarity circuit shown in FIG. 3.

Referring now to FIG. 4, there is shown an embodiment of the read data and polarity circuit 400 shown in FIG. 3. In general, the previous polarity flag 312 is a decoded representation of the previous polarity bits 304. Conversely, the previous polarity bits 304 are an encoded version of the previous polarity flag 312. In this embodiment, an exclusive-or-gate 402 receives the previous polarity bits 304 and provides the previous polarity flag 312. If an odd number of bits in the previous polarity bits 304 are set then the previous polarity flag 312 is set, else if an even number of bits in the previous polarity bits 304 are set then the previous polarity flag 312 is clear.

The read data bits 117 are provided by selectively inverting the previous data bits 302 according to the previous polarity flag 312. In this embodiment, the previous data bits 302 are received by a plurality of exclusive-or-gates 404 which selectively invert the previous data bits 302 according to the previous polarity flag 312.

Figure 5:
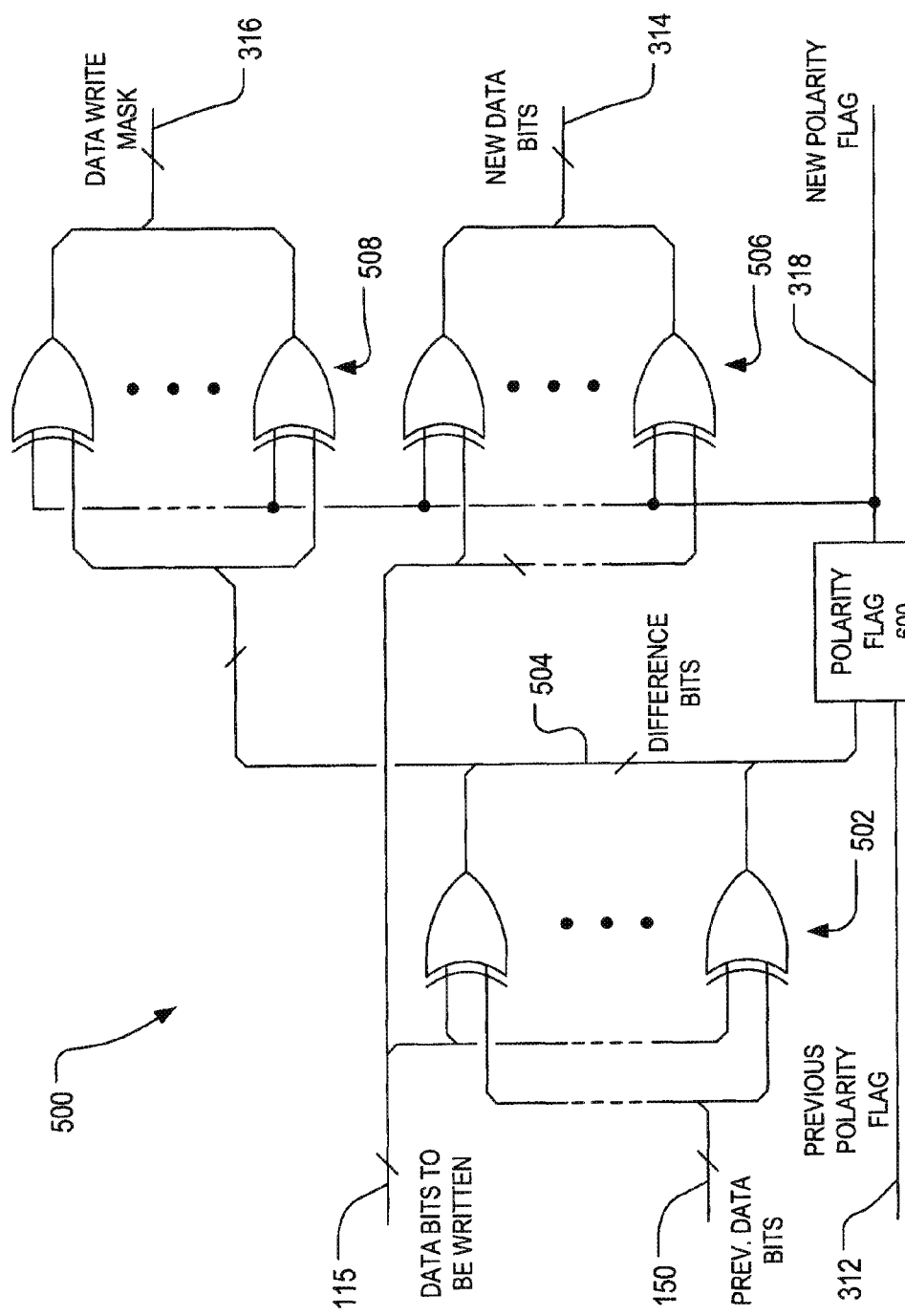
FIG. 5 is a block diagram of a write data compare circuit shown FIG. 3.
Figure 6:
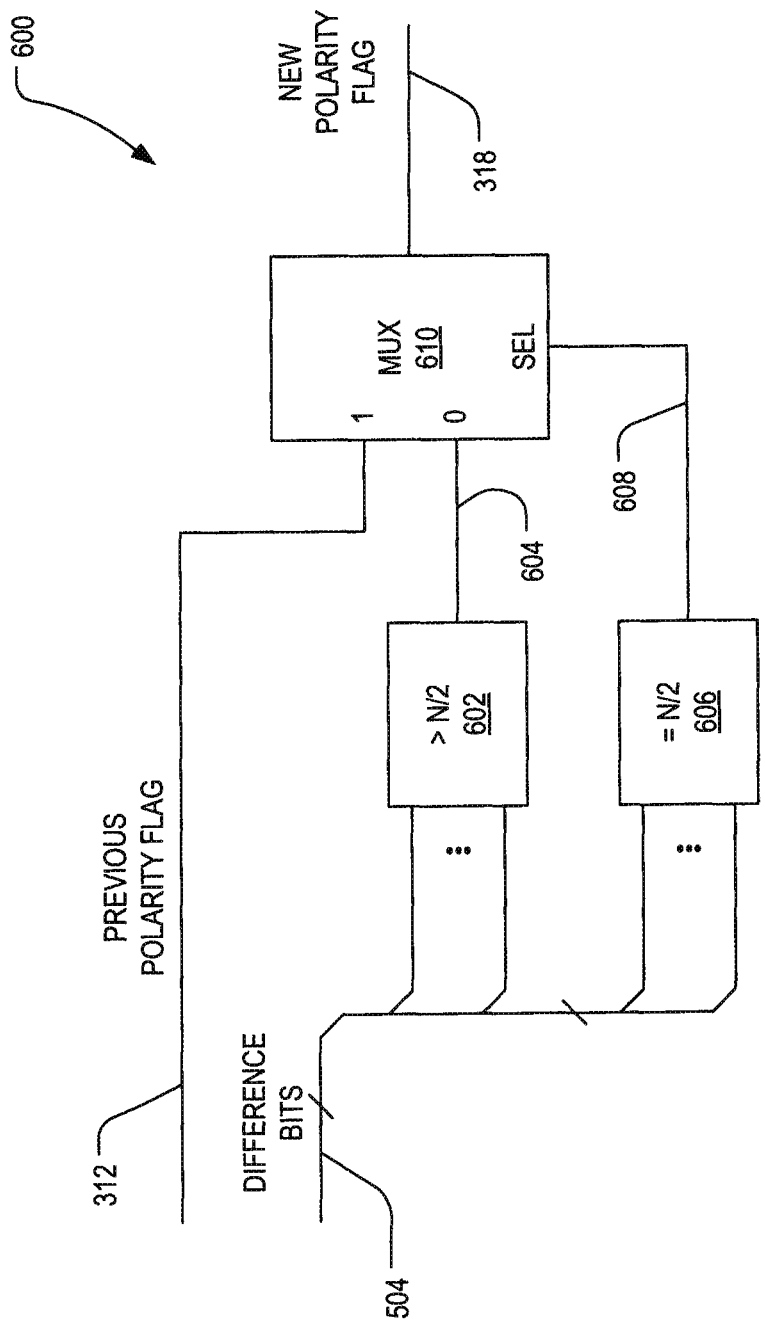
FIG. 6 is a block diagram of a polarity flag circuit shown in FIG. 5.

Referring now to FIG. 5, there is shown an embodiment of the write data bit compare circuit 500 shown in FIG. 3. In general, the write data bit compare circuit 500 compares the data bits to be written 115 with the previous data bits 150 to provide difference bits 504. Based on the difference bits 504 and the previous polarity flag 312 the new polarity flag 318 is provided. Based on the new polarity flag the data bits to be written 115 and difference bits 504 are selectively inverted to provide the new data bits 314 and data write mask 316 respectively. In this embodiment a plurality of exclusive-or-gates 502 is used to compare the data bits to be written 115 with the previous data bits 150 and provide the difference bits 504. A polarity flag circuit 600, described herein below with reference to FIG. 6, is receives the difference bits 504 and previous polarity flag 312 and provide the new polarity flag 318. A plurality of exclusive-or gates 506 is used to selectively invert the data bits to be written 115 according the new polarity flag 318 and provide the new data bits 314. Similarly, a plurality of exclusive-or gates 508 is used to selectively invert the difference bits 504 according to the new polarity flag 318 and provide the data write mask 316.

Referring to FIG. 6, there is shown an embodiment of the polarity flag circuit 600 shown in FIG. 5. In general, if a number of set bits in the difference bits 504 is equal to half of a number (same as N, the number of data bits) of difference bits then the new polarity flag 318 is the same as the previous polarity flag 312. Otherwise, if the number of set bits in the difference bits 504 is greater than half of the number (N) of difference bits then the new polarity flag 318 is set. Otherwise, if the number of set bits in the difference bits 504 is less than half of the number (N) of difference bits then the new polarity flag 318 is clear. In this embodiment, Boolean logic 602 is used to provide a greater-than-half-N signal 604 and Boolean logic 606 is used to provide an equal-to-half-N signal 608 to a multiplexor 610 for selectively providing the previous polarity flag 312 or the greater-than-half-N signal 604 as the new polarity flag 318.

Figure 7:
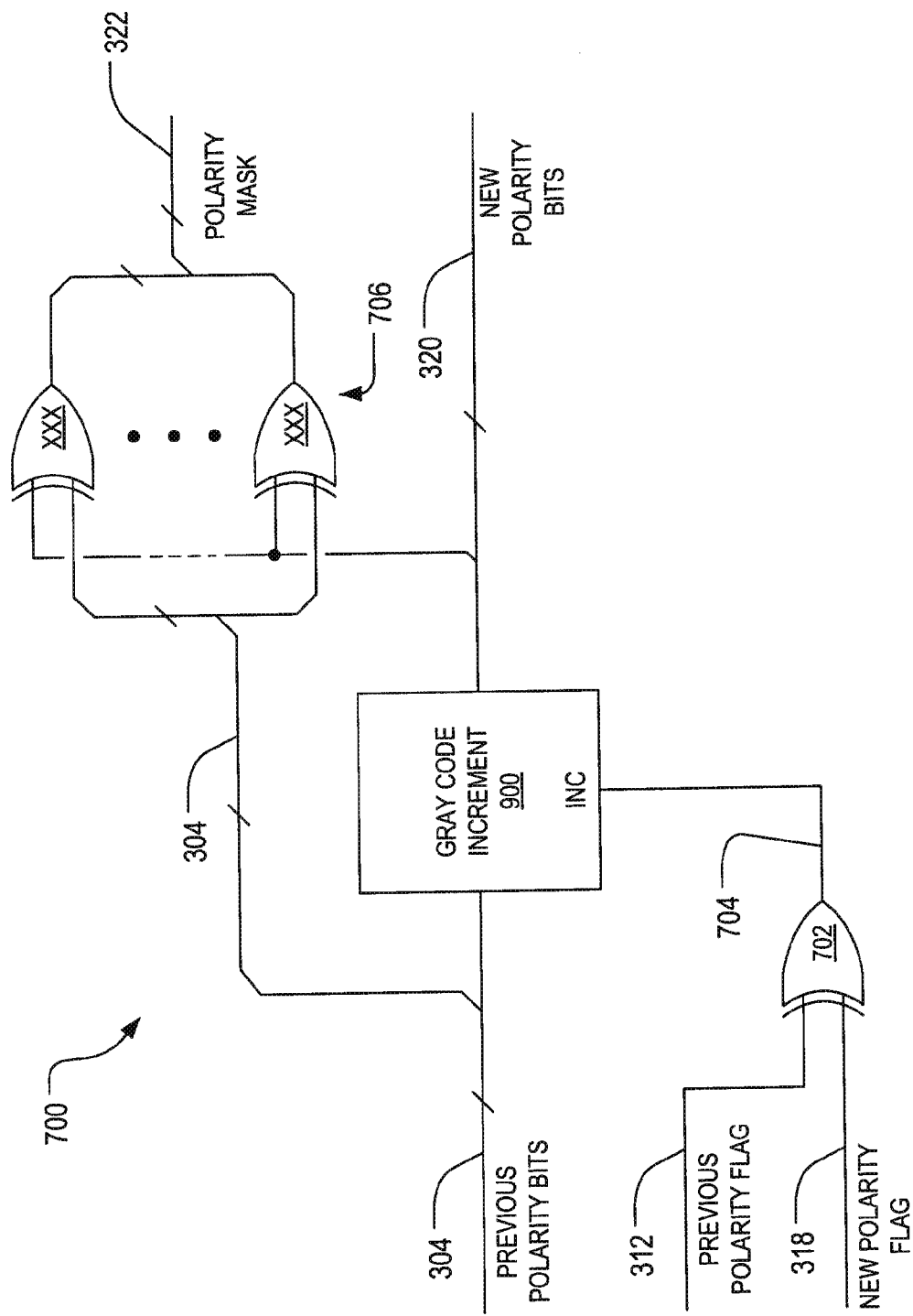
FIG. 7 is a block diagram of a polarity bit circuit shown in FIG. 3.

Referring to FIG. 7, there is shown an embodiment of the polarity bit circuit 700 shown in FIG. 3. In general, if the new polarity flag 318 is different from the previous polarity flag 312 then one of the previous polarity bits 304 is toggled to provide the new polarity bits 320. The new polarity bits 320 are compared with the previous polarity bits 304 to provide a polarity mask 322. In this embodiment, an exclusive-or gate 702 is used to compare the new polarity flag 318 with the previous polarity flag 312 to provide a increment signal 704 to a Gray code increment circuit 900, which is described herein below with reference to FIGS. 8 and 9. The Gray code increment circuit 900 selectively increments the previous polarity 304 according to the increment signal 704 to provide the new polarity bits 320. A plurality of exclusive-or gates 706 is used to compare the new polarity bits 320 are with the previous polarity bits 304 to provide a polarity mask 322.

Figure 8:
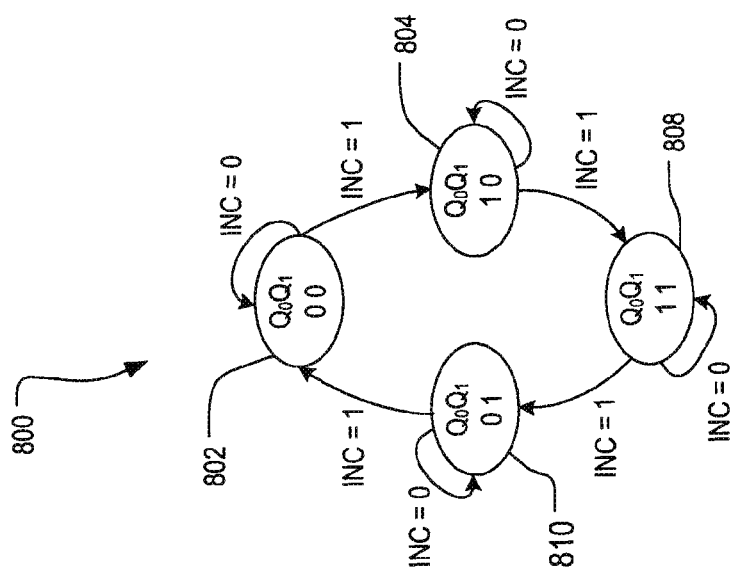
FIG. 8 is a state diagram of a Grey code increment circuit shown in FIG. 7.

Referring to FIG. 8 there is shown a state diagram 800 describing a function of the Gray code increment circuit 900 shown in FIG. 7. This example is based on P=2 polarity bits, however those skilled in the art will readily understand the operation of a Gray code increment circuit 900 based on any number of polarity bits. If the increment signal 704 is set, a state $(Q_0 Q_1)$ is incremented from 00 802 to 10 804, or 10 804 to 11 808, or 11 808 to 01 810, or 01 810 to 00 802. It should be noted that only one polarity bit changes per each change of state. If the increment signal 704 is clear then the state $(Q_0 Q_1)$ remains the same. In general, embodiments based on P polarity bits reduce a wear level of the polarity bits to 1/P times a wear level of conventional apparatuses based on one polarity bit.

Figure 9:
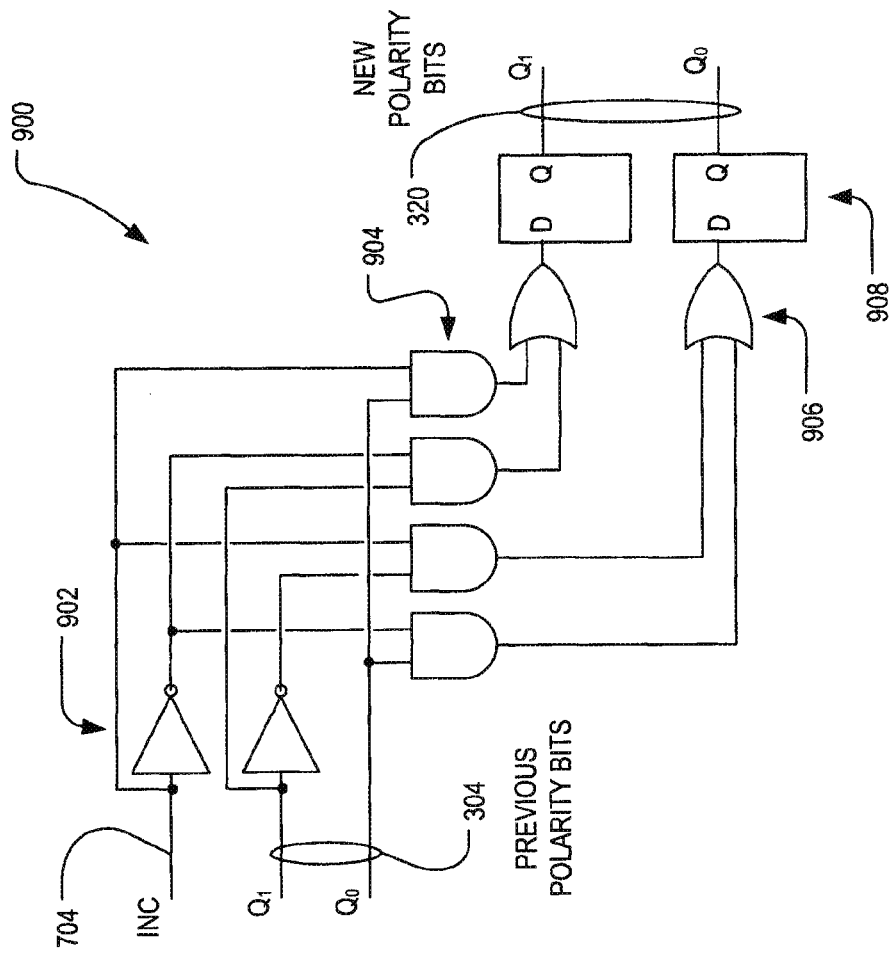
FIG. 9 is a block diagram of the Grey code increment circuit shown in FIG. 7.

FIG. 9 shows an embodiment of the Gray code increment circuit 900 shown in FIG. 7. In this embodiment, a plurality of inverters 902, a plurality of AND gates 904, and a plurality of OR gates 906 are configured to implement the state diagram 800 shown in FIG. 8. The new polarity bits 320 may be latched by a plurality of flip-flops 908.

Figure 10:
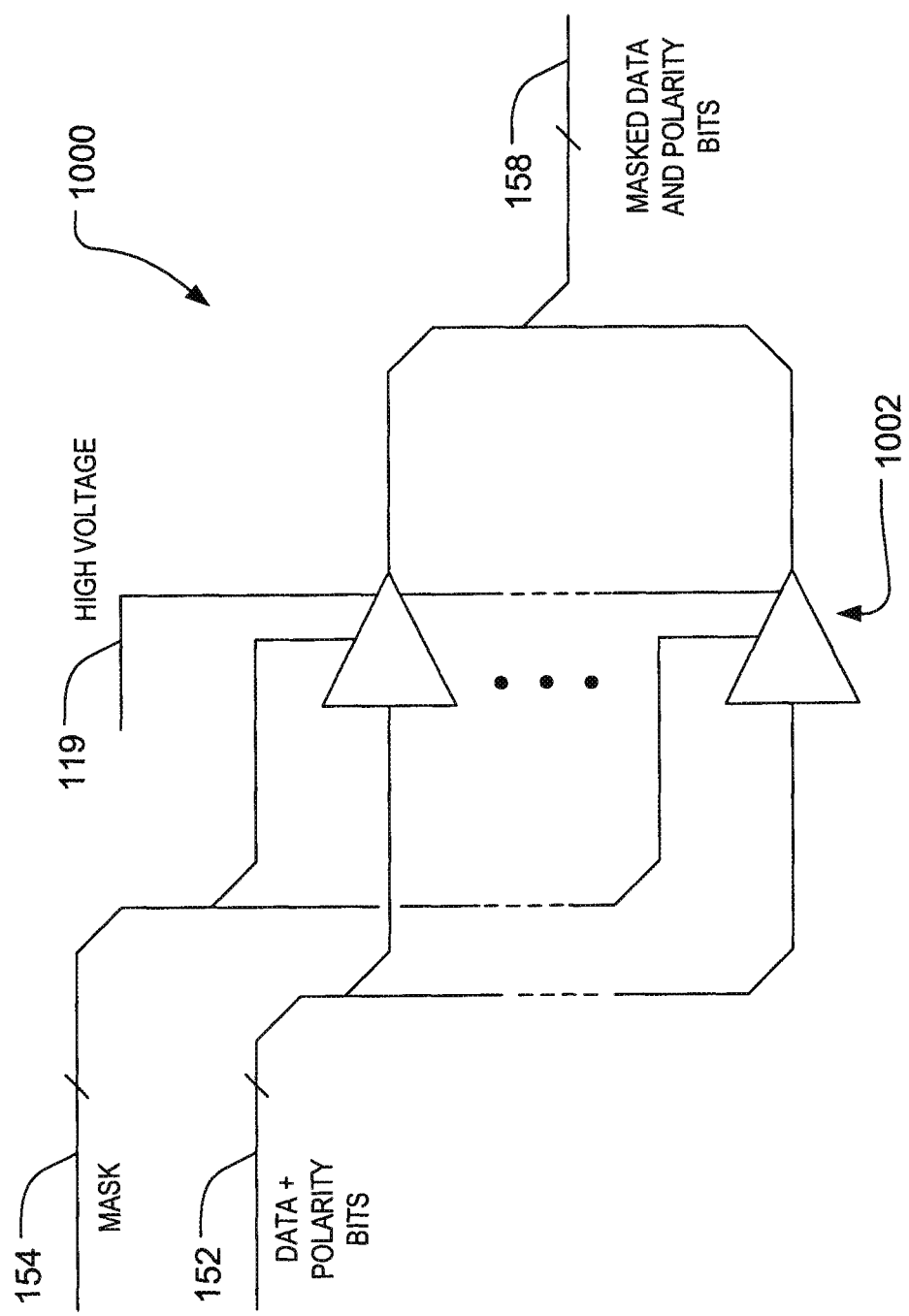
FIG. 10 is a block diagram of a write driver shown in FIG. 1.

Referring now to FIG. 10, there is shown an embodiment of the write driver 1000 shown in FIG. 1. In general, the mask 154 only enables the write driver circuits 1002 that correspond to new data bits 314 and new polarity bits 320 that need to be written, this is: different from the previous data bits 302 and previous polarity bits 304. The enabled write drivers 1002 write the masked data and polarity bits 158 to the data structure 200 via the column selector 128 and bit lines 130 using write and verify methods well known in the art.

Figure 12:
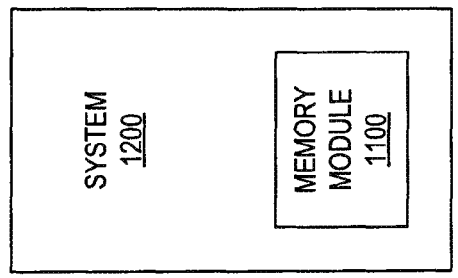
FIG. 12 is a block diagram of a system including the memory module shown in FIG. 11.
Figure 11:
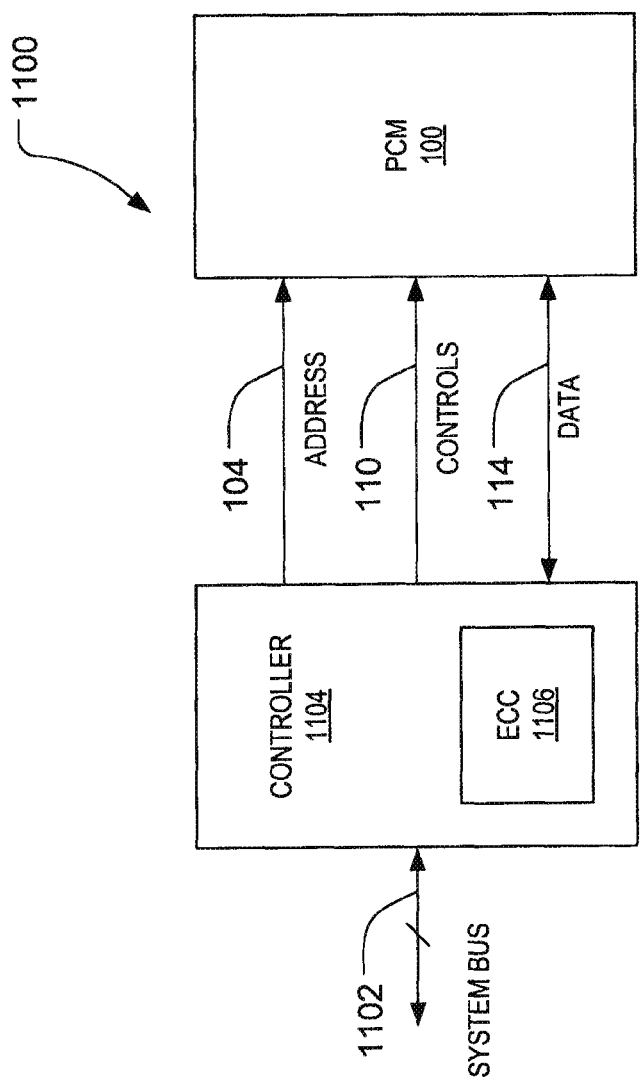
FIG. 11 is a block diagram of a memory module including the PCM apparatus shown in FIG. 1.

Referring to FIG. 11, there is shown a block diagram of a memory module 1100 in accordance with the present invention. Even though only one PCM 100 is shown included in the memory module 1100, any number of PCMs 100 may be used and still be within the scope of the invention. The module 1100 includes a controller 1104 for providing the address signals 104, the control signals 110, and the data signals 114 as well as receiving the data signals 114. Preferably, an Error Correction Code (ECC) circuit 1106 encodes data signals 114 provided to the PCM 100 and decodes data signals 114 received from the PCM 100. The controller 1104 also includes a system interface, e.g. a system bus, 1102 for interfacing to a system 1200 as shown in FIG. 12. The memory module 1100 may be, for example, a memory stick, a solid state disk (SSD), a laptop computer, a desktop computer, a personal digital assistant (PDA), audio player, or the like where the advantages of embodiments of the present invention as described herein are especially beneficial.

In accordance with the present invention there are also provided methods for writing data to the PCM apparatus 100 and reading data from the PCM apparatus 100.

A method of writing data to addressed one of the M data fields 202 and polarity bit fields 204 will now be described with reference to a flowchart 1300 shown in FIGS. 13A to 13D. A legend 1301 shows a relative relationship between FIGS. 13A to 13D.

Figure 13A:
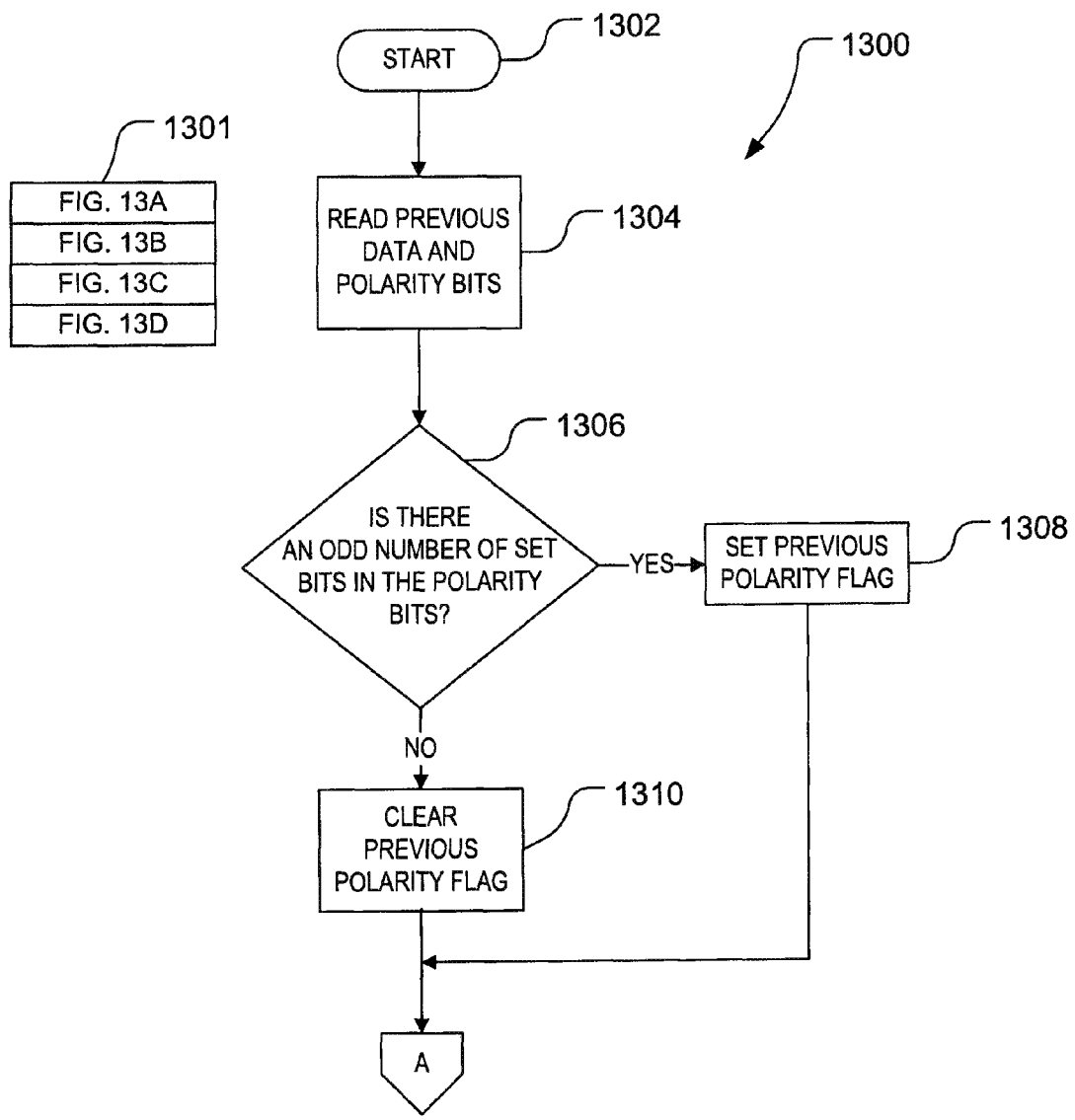
FIGS. 13A to 13D are a flowchart of a method of writing data to the data storage structure shown in FIGS. 1 and 2.

Starting at 1302 in FIG. 13A, read previous data bits and previous polarity bits 1304 that are already in the data field 202 and polarity bit field 204. If there is an odd number of set bits in the previous polarity bits 1306 then set a polarity flag 1308, otherwise clear the previous polarity flag 1310.

Figure 13B:
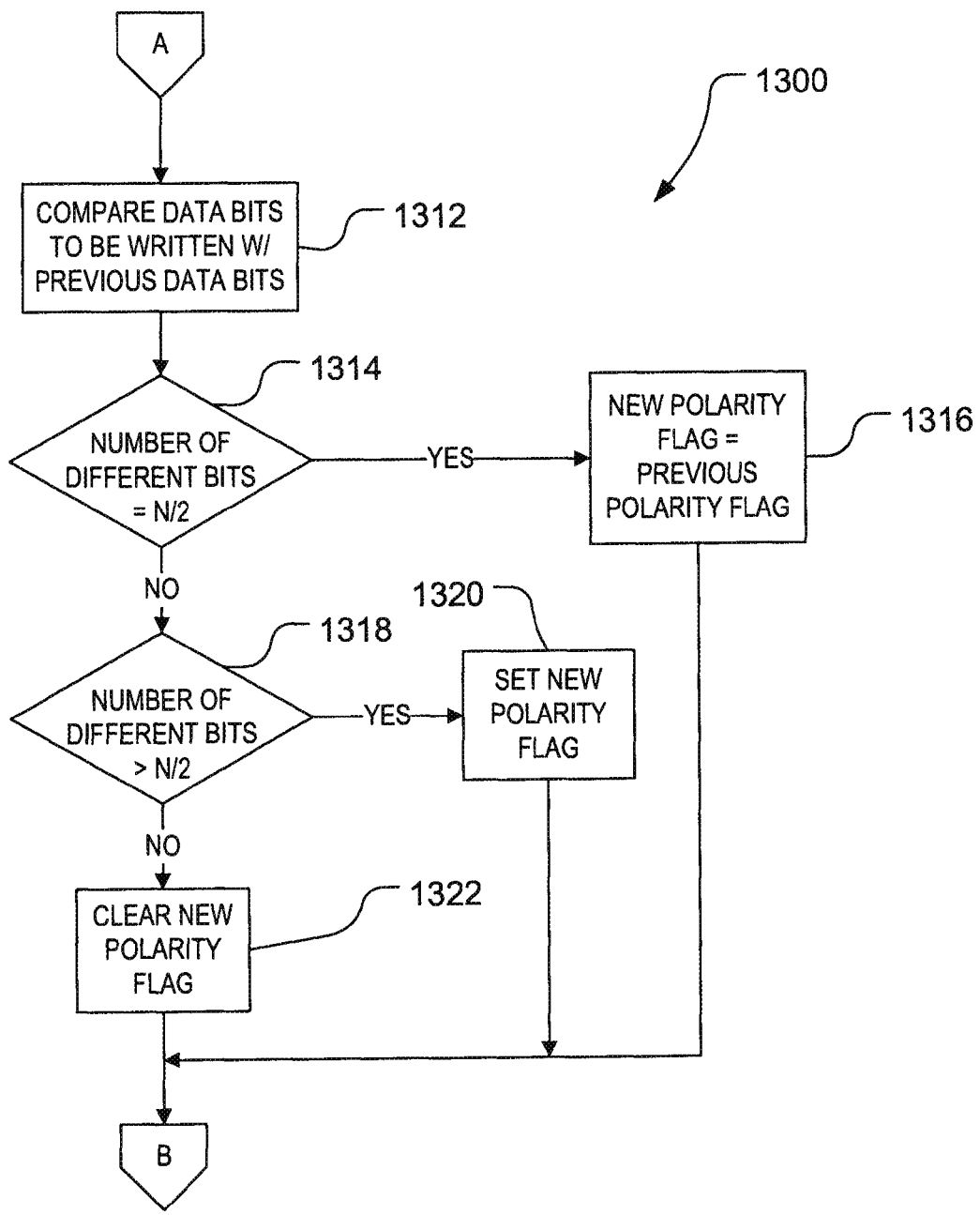

Next, referring to FIG. 13B, compare data bits to be written to the previous data bits (from 1304) 1312. If a number of the data bits to be written that are different from the previous data bits is equal to half of a number of the data bits to be written 1314 then assign a new polarity flag to be equal to the previous polarity flag (from 1308,1310) 1316. Otherwise, if the number of the data bits to be written that are different from the previous data bits is greater than half of the number of the data bits to be written then set the new polarity flag 1320, else clear the new polarity flag 1322.

Figure 13C:
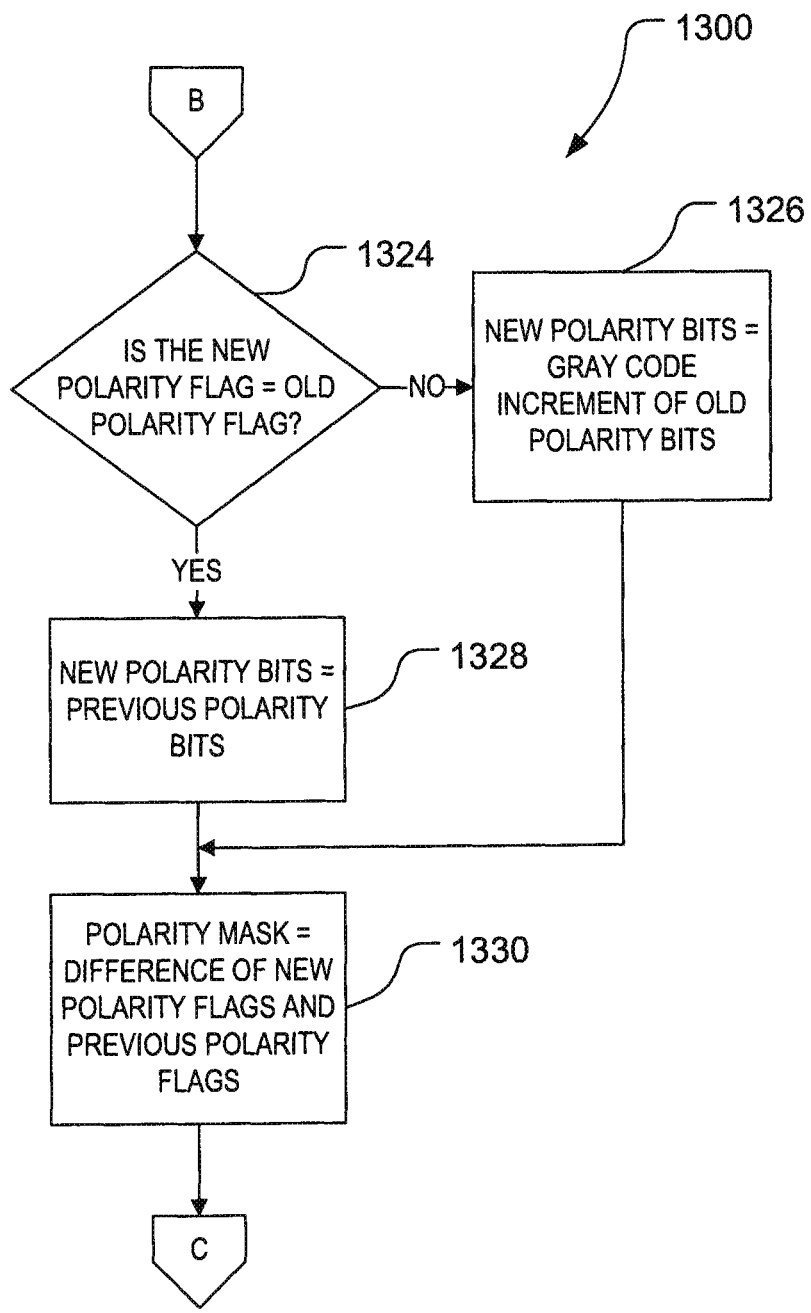

Next, referring to FIG. 13C, if the new polarity flag is the same as the previous polarity flag 1324, then assign the new polarity bits to be a Gray code increment of the previous polarity bits (from 1304) 1326, otherwise assign the new polarity bits to be the same as the previous polarity bits 1328. Then, assign the polarity masks to be the difference between the new polarity bits and the previous polarity bits 1330.

Figure 13D:
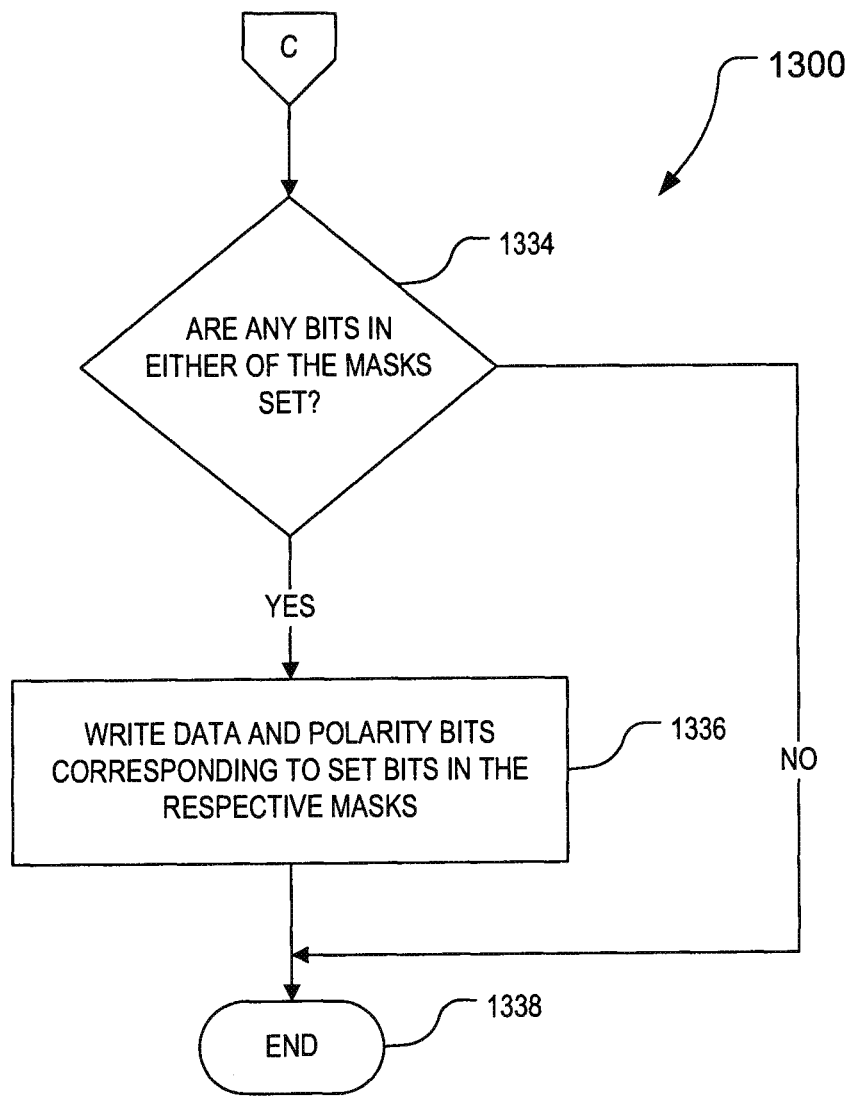

Next, referring to FIG. 13D, if there are any bits set in either the data mask or the polarity mask then write only the new data and polarity bits that correspond to the set bits in the data mask and the polarity mask 1336. The write method ends at 1338.

A method for writing the plurality of data fields 202 in the data structure 200 in a burst mode will now be described with reference to a flowchart 1400 in FIG. 14. Starting at 1402, the method for writing 1300 described herein above with reference to FIGS. 13A to 13D, is repeated M times 1404,1406. In each repetition a column address I is incremented. The burst write method ends at 1408.

A method of reading data from a data structure 200 will be now described with reference to a flowchart 1500 in FIG. 15. Starting at 1502, previous data bits and polarity bits are read 1504. If there are an odd number of set bits in the polarity bits 1506, then invert the previous data bits to provide the data 1508. Otherwise, use the previous data bits to provide the data. The method ends at 1510.

A method for reading the plurality of data fields 202 in the data structure 200 in a burst mode will now be described with reference to a flowchart 1600 in FIG. 16. Starting at 1602, the method for reading 1500 described herein above with reference to FIG. 15, is repeated M times 1604,1606. In each repetition a column address incremented. The burst write method ends at 1608.

Therefore apparatuses and systems including a PCM with multiple polarity bits having enhanced endurance and improved error tolerance and systems using same have been provided.

The embodiments of the invention described above are intended to be exemplary only. The scope of the invention is therefore intended to be limited solely by the scope of the appended claims.

What is claimed is:

1. A Phase-Change Memory (PCM) apparatus comprising:
    a data field for storing a plurality of data bits representing a data value or an inversion of the data value; and
    a polarity field for storing a plurality of polarity bits for indicating that the data bits stored in the data field represent the data value or the inversion of the data value.

2. The PCM apparatus as claimed in claim 1 wherein an odd number of set polarity bits indicates that the data bits represent the inversion of the data value and wherein an even number of set polarity bits indicates that the data bits represent the data value.

3. The PCM apparatus as claimed in claim 2 further comprising:
    a circuit for receiving data from the data field;
    a circuit for receiving polarity bits from the polarity field;
    a circuit for determining whether the data received from the polarity field has an odd number of set bits and for setting a previous polarity flag;
    a circuit for inverting the data from the data field if there is an odd number of set bits in the bits received from the polarity field.

4. The PCM apparatus as claimed in claim 3 further comprising:
    a circuit for comparing data to be written to the data field with the data received from the data field and providing a difference;
    circuit for receiving the difference and receiving the polarity flag and determining whether to invert the data to be written to the data field and determining whether to invert the difference for providing a data write mask.

5. The PCM apparatus as claimed in claim 4 further comprising:
    a circuit for determining whether a number set bits in the difference is greater than half of a total number of bits in the difference and providing a difference greater than bit;
    a circuit for determining whether a number set bits in the difference is equal half of the total number of bits in the difference and providing a difference equal to bit; and
    a multiplexor circuit for providing a polarity bit that is equal to the previous polarity bit if the number set bits in the difference is equal half of the total number of bits in the difference or is equal to the difference greater bit if the number set bits in the difference is not equal to half of the total number of bits in the difference.

6. The PCM apparatus as claimed in claim 5 further comprising:
    an increment circuit for selectively incrementing the previous polarity bits and providing the new polarity bits if the new polarity flag is equal to the previous polarity flag; and
    a circuit for comparing the previous polarity bit with the new polarity bit and providing a polarity bit mask.

7. The PCM apparatus as claimed in claim 6 wherein the incrementing circuit comprises a gray code incrementing circuit for selectively incrementing the previous polarity bits.

8. The PCM apparatus as claimed in claim 1 further comprising:
   a plurality of write drivers for selectively writing respective data bits.

9. A method of writing data to a data structure in a Phase-Change Memory apparatus, the method comprising:
   reading a plurality of previous data bits and a plurality of previous polarity bits from the data structure in the PCM apparatus;
   determining if an odd number of the previous polarity bits are set;
   setting a previous polarity flag if an odd number of the previous polarity bits are set otherwise clearing the previous polarity flag;
   comparing data bits to be written with the plurality of previous data bits and determining a new plurality of polarity bits;
   selectively inverting the data bits to be written according to the new plurality of data bits; and
   writing only the selectively inverted data bits and new plurality of polarity that are different from the previous data bits and plurality of previous polarity bits respectively.

10. A method of reading data from a data structure in a Phase-Change Memory apparatus, the method comprising:
    reading a plurality of data bits and a plurality of polarity bits from the data structure in the PCM apparatus; and
    provided there is an odd number of the previous polarity bits set, inverting the data bits.

* * * * *